United States Patent [19]

Kadakia et al.

[11] Patent Number: 4,963,765
[45] Date of Patent: Oct. 16, 1990

[54] HIGH SPEED CMOS TRANSITION DETECTOR CIRCUIT

[75] Inventors: Shailesh R. Kadakia, Stafford; David D. Wilmoth, Sugar Land, both of Tex.

[73] Assignee: Texas Instruments Incorporated, Dallas, Tex.

[21] Appl. No.: 376,920

[22] Filed: Jul. 3, 1989

[51] Int. Cl.$^5$ ............... H03K 19/094; H03K 5/12
[52] U.S. Cl. ............... 307/443; 307/451; 307/263; 307/350; 307/568
[58] Field of Search ........... 307/443, 445, 448, 449, 307/451, 464, 263, 264, 265, 591, 517, 350

[56] References Cited

U.S. PATENT DOCUMENTS

| | | | |
|---|---|---|---|
| 3,995,171 | 11/1976 | Sonoda | 307/449 |
| 4,384,216 | 5/1983 | Pricer | 307/263 |
| 4,461,964 | 7/1984 | Shiotari | 307/354 |
| 4,506,164 | 3/1985 | Higuchi | 307/264 |
| 4,567,378 | 1/1986 | Raver | 307/263 |
| 4,616,143 | 10/1986 | Miyamoto | 307/264 |
| 4,649,290 | 3/1987 | Yamamoto | 307/268 |
| 4,689,495 | 8/1987 | Liu | 307/264 |
| 4,742,247 | 5/1988 | Venkatesh | 307/451 |
| 4,757,214 | 2/1988 | Kobayashi | 307/601 |
| 4,797,573 | 1/1989 | Ishimoto | 307/265 |
| 4,811,304 | 3/1989 | Matsuda et al. | 307/449 |
| 4,833,348 | 5/1989 | Hannai | 307/449 |

*Primary Examiner*—Timothy P. Callahan
*Attorney, Agent, or Firm*—Theodore D. Lindgren

[57] ABSTRACT

A high speed circuit for detecting input or address transitions at a terminal of an integrated circuit logic array. The circuit utilizes N-channel leaker transistors to control the widths of and P-channel transistors to control the risetimes of output pulses and utilizes inverters and OR circuits to sense input or address transitions of both polarities.

27 Claims, 2 Drawing Sheets

HIGH SPEED CMOS TRANSITION DETECTOR CIRCUIT

This application is a continuation of application Ser. No. 150,862, filed Feb. 1, 1988, now abandoned.

BACKGROUND OF THE INVENTION

This invention relates to a circuit for detecting voltage input level changes or bit signal transitions at the terminals of integrated circuit logic arrays.

Previously available circuits for detection of such input or address transitions have required separate supply voltage sources to drive width control circuitry, have been unreliable when sensing transitions from a large number of address inputs, have required circuit elements other than complementary metal oxide semiconductor (CMOS) devices, and have consumed relatively large amounts of power. Accordingly, there is a need for an address detection circuit that eliminates the foregoing disadvantages of prior art circuits.

SUMMARY OF THE INVENTION

This invention provides a very high speed circuit for detecting input or address transitions at a terminal of an integrated circuit logic array. The circuit requires no separate supply voltage source to drive width control circuitry, provides reliable sensing of input or address transitions when several such circuits are connected to a large number of address inputs, uses CMOS devices only, and consumes a negligible amount of power. The circuit is comprised of a local transition detector means and of a logic means for combining the outputs of multiple local transition detector means to form a final pulse indicating the presence of transitions.

BRIEF DESCRIPTION OF THE DRAWINGS

The novel features of this invention are set forth in appended claims. The invention, its features, and its advantages are described below in conjunction with the following drawings:

DETAILED DESCRIPTION OF THE EMBODIMENT

Figure 1:
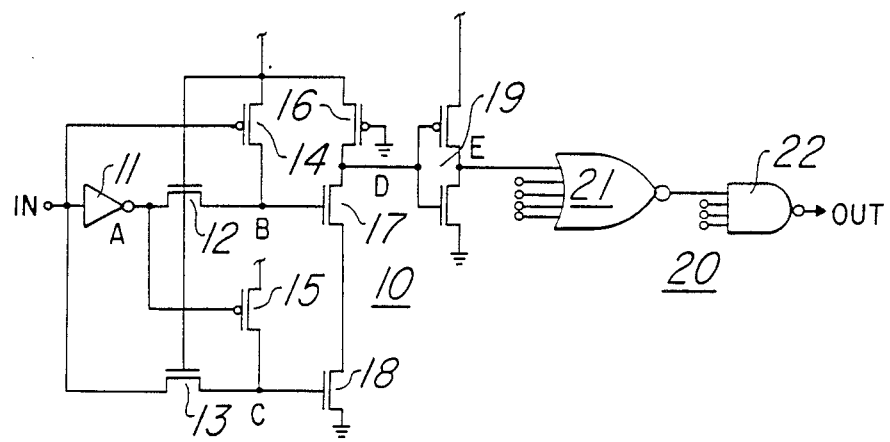
FIG. 1 is a circuit diagram of the input or address transition detector circuit means of this invention, illustrating its use with other such circuits as inputs to a logic means.

Referring to FIG. 1, local transition detector means 10 includes first inverter 11, which is connected, typically through one or more buffers, between address or input terminal IN and an inverted input signal node A. Terminal IN represents the connection of a terminal of an integrated circuit to the input terminal of local transmission detector means 10. The source-drain terminals of first N-channel leaker device 12 are connected between inverted input signal node A and first pulse node B. The source-drain terminals of second N-channel leaker device 13 are connected between input terminal IN and second pulse node C. The gates of leaker devices 12 and 13 are connected to the supply voltage source.

The source-drain terminals of first risetime P-channel control device 14 are connected between the supply voltage source and first pulse node B. The gate terminal of first risetime control device 14 is connected to input terminal IN. Similarly, the source-drain terminals of second risetime P-channel control device 15 are connected between the supply voltage source and second pulse node C. The gate terminal of second risetime control device 15 is connected to the inverted input signal node A.

Output driver devices 16, 17 and 18 constitute a first NAND circuit and have source-drain terminals connected in series between the supply voltage source and ground or other reference voltage with P-channel device 16 nearest the supply voltage. N-channel device 17 is connected between device 16 and N-channel device 18. The output node D of NAND circuit 16,17,18 is the common source-drain terminal of devices 16 and 17. The gate of P-channel device 16 is connected to ground or other reference voltage. The gates of devices 17 and 18 are connected to first and second pulse nodes B and C respectively.

Second inverter 19 is illustrated as a series connections of the source-drain terminals of a P-channel device and an N-channel device between the supply voltage source and ground or other reference voltage. Gate terminals of the device are connected to NAND circuit output node D. Second inverter 19 and first NAND circuit 16,17,18 constitute a first NOR circuit. The output node E of second inverter 19, which is also the output terminal of local transition detector 10, is taken from the common source-drain connection of the P-channel and the N-channel devices.

Figure 2:
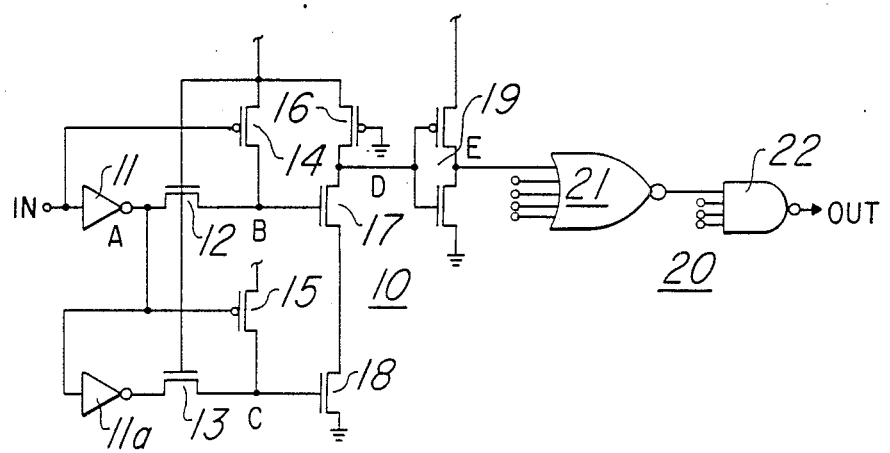
FIGS. 2, 3 and 4 are circuit diagrams of alternative forms of the transition detector circuit means of this invention.

Referring to FIG. 2, the circuit indicated is similar to that of FIG. 1 with the exception that a third inverter 11a is used to reinvert the signal at node A for connection to a source-drain terminal of second leaker device 13. As used herein, the terms "connected" and "connection" include connection to or through a reinverted signal from a particular point in the circuit.

Figure 3:
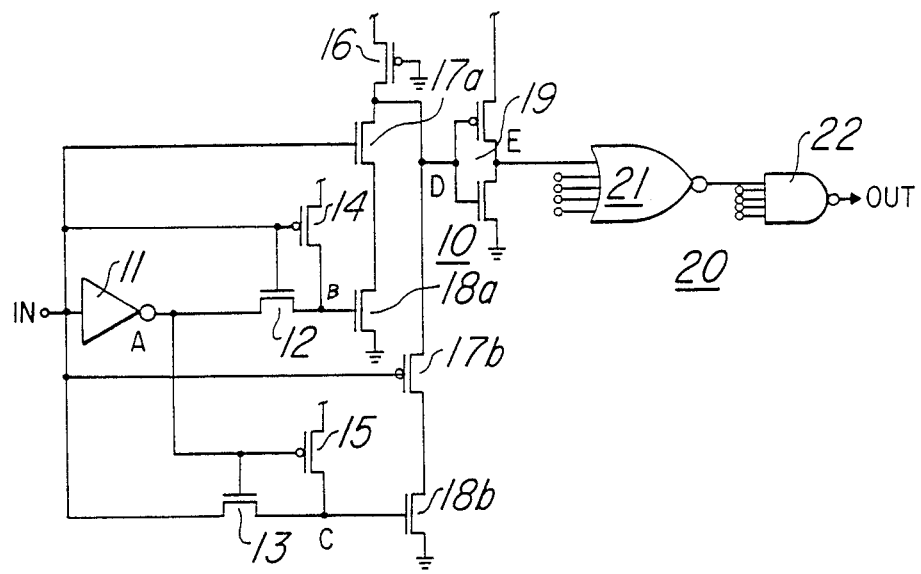

Referring to FIG. 3, the gates of leaker transistors 12 and 13 are connected to input terminal IN and the inverted signal at node A, respectively. The gates of transistors 17a and 17b of first NAND circuit 16, 17a, 18a, 17b, 18b are connected to input signal IN and the gates of transistors 18a and 18b are connected to the source-drain paths of leaker transistors 12 and 13, respectively.

Figure 4:
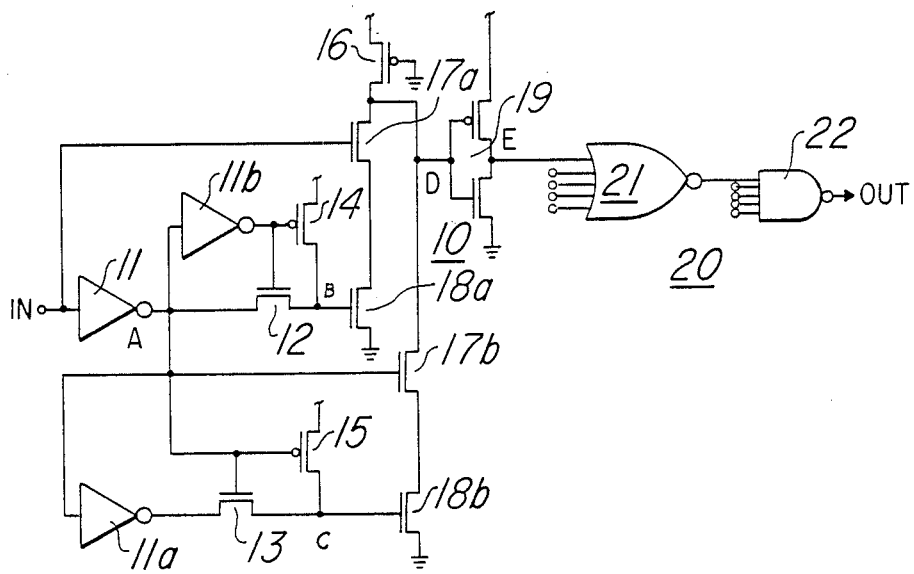

Referring to FIG. 4, the circuit indicated is similar to that of FIG. 3 with the exceptions that third and fourth inverters 11a and 11b are used to reinvert the signal at node A for connections to a source-drain terminal of second leaker device 13 and to the gate of first risetime control device 14, respectively, and that transistor 17b is of N-channel type with gate connected to the inverted input signal at node A.

Referring to FIGS. 1, 2 and 3, logic means 20 is comprised of an OR circuit illustrated as second NOR device 21 in series with second NAND device 22. Multiple inputs from local transition detectors 10 are connected to OR circuit 20. Use of NOR and NAND devices permits fewer input connections to any one device where the application requires monitoring of a large number of input terminals. The voltage at the output terminal OUT of OR circuit 20 is, for example, at a relatively high level if a transition signal causes a node E of any device 10 to be at a relatively high level.

Referring again to FIG. 1 for discussion of operation of detector 10, it may be assumed for purposes of illustration that the input or address signal at terminal IN has been at a relatively high potential for a relatively long period of time. In that event, first inverter 11 has caused the potential at node A to be at relatively low potential. Pulse duration control devices 12 and 13, shown as channel transistors, have caused node B to be at relatively low potential and node C to be at a relatively high potential. The relatively low voltage at node B causes device 17 to be relatively nonconductive and the relatively high voltage at node C causes device 18 to be relatively highly conductive. The voltage at node D is determined by the voltage division among devices 16, 17 and 18. The voltage at node D under the foregoing conditions is relatively high compared to the voltage at node D under a condition in which both devices 17 and 18 are in a highly conductive state. The inverted voltage at node E is, with node D at a relatively high level, at a relatively low level.

Given the status of the circuit as described in the previous paragraph, if the input or address signal at node IN suddenly decreases to a relatively low level, the voltages at nodes A and B will suddenly increase, the voltage at node D will suddenly decrease, and the voltage output at node E will suddenly increase. The voltage at node C will subsequently decrease relatively slowly through low-conductivity leaker device 13, which has its gate biased for conduction by connection to the supply voltage. As the voltage at node C decreases slowly, the voltage at node D will correspondingly increase slowly. The output at node E is, as before, the inverse of the voltage change at node D.

The circuits of FIGS. 2, 3 and 4 operate in a similar manner.

In the circuits of FIG. 1, 2 and 4, risetime device 15 will be turned on only after a time delay caused by first inverter 11. The circuit of FIG. 3 removes the inversion delay through use of P-channel device 17b in a second leg of first NAND circuit 16, 17a, 18a, 17b, 18b by causing transistor 17b to turn on by a negative transition at terminal IN while N-channel transistor 17a is turned on by a positive transistion. The delays may be made identical by appropriately sizing of P-channel and N-channel devices.

Whereas the foregoing discussion assumed that the input voltage at terminal IN had been at a relatively high level for a relatively long period of time, an assumption that the input voltage had been at relatively low level for a relatively long period of time before changing to a higher level would result in the same output voltage at nodes D and E.

Rapidly occuring transitions between high and low voltage inputs at terminal IN will prevent either node B or C from reaching a low level and will, therefore, cause the voltage output at terminal E to remain at a relatively high level.

The output pulse duration at terminal E is controlled by the widths and lengths of the channels of leaker devices 12 and 13.

The rate of sudden increase in voltage or the risetime at node E is a function of the widths and lengths of the channels of risetime control devices 14 and 15.

While the invention has been described with reference to illustrative embodiments, the description is not to be construed in a limiting sense. Various modifications of the illustrative embodiments of the invention will be apparent to those of skill in the art and it is contemplated that the appended claims will cover any such modifications that fall within the scope of the invention.

What is claimed is:

1. A circuit for detecting transitions in voltage, the circuit comprising:
    at least one input having a first signal corresponding to said transitions in voltage;
    at least one inverted input having a second signal corresponding to inversions of said transitions in voltage;
    a supply voltage and a reference potential;
    an output for providing an output voltage upon detection of one of said transitions or of said inversions;
    a P-channel transistor having a source-drain path and having a gate, said source-drain path of said P-channel transistor connected between said supply voltage and said output, said gate of said P-channel transistor connected to said reference potential;
    a first and second N-channel transistors, each having a source-drain path and having a gate, said source-drain paths of said first and second N-channel transistors connected in series between said output and said reference potential;
    first and second N-channel leaker devices, each having a source-drain path and having a gate, said source-drain path of said first N-channel leaker device connected between a said inverted input and said gate of said first N-channel transistor, said gate of said first N-channel leaker device connected to said supply voltage, said source-drain path of said second N-channel leaker device connected between a said input and said gate of said second N-channel transistor, said gate of said second N-channel leaker device connected to said supply voltage.

2. The circuit of claim 1, including
    a first risetime control device having a source-drain path and having a gate, said source-drain path of said first risetime control device connected between said supply voltage and said gate of said first N-channel transistor, said gate of said first risetime control device connected to a said input; and
    a second risetime control device having a source-drain path and having a gate, said source-drain path of said second risetime control device connected between said supply voltage and said gate of said second N-channel transistor, said gate of said second risetime control device connected to a said inverted input.

3. The circuit of claim 1, including
    a first risetime control transistor of a predetermined conductivity-type having a source-drain path and having a gate, said source-drain path of said first risetime control transistor connected between said supply voltage and said gate of said first N-channel transistor, said gate of said fist risetime control transistor connected to a said input; and
    a second risetime control transistor of said predetermined conductivity-type having a source-drain path and having a gate, said source-drain path of said second risetime control transistor connected between said supply voltage and said gate of said second N-channel transistor, said gate of said second risetime control transistor connected to a said inverted input;
    wherein said predetermined conductivity-type is P-type.

4. The circuit of claim 1, including
    a first risetime control transistor having a source-drain channel path and having a gate, said source-drain channel path of said first risetime control transistor having a predetermined width and length, said source-drain channel path of said first risetime control transistor connected between said supply voltage and said gate of said first N-channel transistor, said gate of said first risetime control transistor connected to a said input; and a second risetime control transistor having a source-drain channel path and having a gate, said source-drain channel path of said second risetime control transistor having a predetermined width and length, said source-drain channel path of said second risetime control transistor connected between said supply voltage and said gate of said second N-channel transistor, said gate of said second risetime control transistor connected to a said inverted input;

wherein said risetime of said output voltage at said output is determined by said predetermined source-drain channel widths and lengths of said first and second risetime control devices.

5. The circuit of claim 1, wherein said first and second leaker devices are N-channel field-effect transistors.

6. The circuit of claim 1, wherein the duration of said output voltage at said output is determined by the widths and lengths of said source-drain paths of said first and second leaker devices.

7. The circuit of claim 1, including an inverter having an input, said input of said inverter connected to said output of said circuit.

8. The circuit of claim 1, including an inverter having an input and having an output, said input of said inverter connected to said output of said circuit; and a NOR circuit having an input, said input of said NOR circuit connected to said output of said inverter.

9. The circuit of claim 1, including an inverter having an input and having an output, said input of said inverter connected to said output of said circuit;

a NOR circuit having an input and having an output, said input of said NOR circuit connected to said output of said inverter; and a NAND circuit having an input, said input of said NAND circuit connected to said output of said NOR circuit.

10. A circuit for detecting transitions in voltage at a terminal of an integrate logic array, the circuit comprising:

a supply voltage;

a reference potential;

at least one input having a signal corresponding to said transitions in voltage;

at least one inverted input having a second signal corresponding to inversions of said transitions in voltage;

an output for providing an output voltage upon detection of one of a said transition of said inversions;

a P-channel transistor having a source-drain path and having a gate, said source-drain path of said P-channel transistor connected between said supply voltage and said output, said gate of said P-channel transistor connected to said reference potential;

first and second N-channel transistors, each having a source-drain path and having a gate, said source-drain paths of said first and second N-channel transistors connected in series between said output and said reference potential, said gate of said first N-channel transistor connected to a said input;

third and fourth N-channel transistors, each having a source-drain path and having a gate, said source-drain paths of said third and fourth N-channel transistors connected in series between said output and said reference potential, said gate of said third N-channel transistor connected to a said inverted input; and first and second N-channel leaker devices, each having a source-drain path and having a gate, said source-drain path of said first N-channel leaker device connected between a said inverted input and said gate of said second N-channel transistor, said gate of said first N-channel leaker device connected to a said input, said source-drain path of said second N-channel leaker device connected between a said input and said gate of said fourth N-channel transistor, and said gate of said second N-channel leaker device connected to a said inverted input.

11. The circuit of claim 10, including a first risetime control device having a source-drain path and having a gate, said source-drain path of said first risetime control device connected between said supply voltage and said gate of said second N-channel transistor, said gate of said first risetime control device connected to a said input, and a second risetime control device having a source-drain path and having a gate, said source-drain path of said second risetime control device connected between said supply voltage and said gate of said fourth N-channel transistor, said gate of said second risetime control device connected to a said inverted input.

12. The circuit of claim 10, including a first risetime control transistor of a predetermined conductivity-type having a source-drain path and having a gate, said source-drain path of said first risetime control transistor connected between said supply voltage and said gate of said second N-channel transistor, said gate of said first risetime control transistor connected to a said input, and a second risetime control transistor of said predetermined conductivity-type having source-drain path and having a gate, said source-drain path of said second risetime control transistor connected between said supply voltage and said gate of said fourth N-channel transistor, said gate of said second risetime control transistor connected to a said inverted input;

wherein said predetermined conductivity-type is P-type.

13. The circuit of claim 10, including a first risetime control transistor having a source-drain channel path and having a gate, said source-drain path of said first risetime control transistor having predetermined width and length, said source-drain channel path of said first risetime control transistor connected between said supply voltage and said gate of said second N-channel transistor, said gate of said first risetime control transistor connected to a said input, and a second risetime control transistor having source-drain channel path and having a gate, said source-drain path of said second risetime control transistor having predetermined width and length, said source-drain channel path of said second risetime control transistor connected between said supply voltage and said gate of said fourth N-channel transistor, said gate of said second risetime control transistor connected to a said inverted input;

wherein said risetime of said output voltage at said output is determined by said predetermined source-drain channel path widths and lengths of said first and second risetime control transistors.

14. The circuit of clam 10, wherein said first and second leaker devices are N-channel field-effect transistors.

15. The circuit of claim 10, wherein the duration of said output voltage at said output is determined by the widths and lengths of said source-drain paths of said first and second leaker devices.

16. The circuit of clam 10, including an inverter having an input, said input of said inverter connected to said output of said circuit.

17. The circuit of clam 10, including
an inverter having an input and having an output, said input of said inverter connected to said output of said circuit; and
a NOR circuit having an input, said input of said NOR circuit connected to said output of said inverter.

18. The circuit of claim 10, including
an inverter having an input and having an output, said input of said inverter connected to said output of said circuits;
a NOR circuit having an input and having an output, said input of said NOR circuit connected to said output of said inverter; and
a NAND circuit having an input, said input of said NAND circuit connected to said output of said NOR circuit.

19. A circuit for detecting transitions in voltage at a terminal of an integrated logic array, the circuit comprising:
a supply voltage;
a reference potential;
at least one input having a signal corresponding to one of said transitions in voltage;
at least one inverted input having a signal corresponding to an inversion of said one transition in voltage;
an output for providing an output voltage upon detection of one of said transitions or said inversions;
a first P-channel transistor having source-drain path and having a gate, said source-drain path of said first P-channel transistor connected between said supply voltage and said output, said gate of said first P-channel transistor connected to said reference potential;
first and second N-channel transistors, each having a source-drain path and having a gate, said source-drain paths of said first and second N-channel transistors connected in series between said output and said reference potential, said gate of said first N-channel transistor connected to a said input;
a second P-channel transistor and a third N-channel transistor, each having a source-drain path and having a gate, said source-drain paths of said second P-channel transistor and of said third N-channel transistor connected in series between said output and said reference potential, said gate of said second P-channel transistor connected to a said input; and first and second n-channel leaker devices, each having a source-drain path and having a gate, said source-drain path of said first N-channel leaker device connected between a said inverted input and said gate of said second N-channel transistor, said gate of said first N-channel leaker device connected to a said input signal, said source-drain path of said second N-channel leaker device connected between a said input and said gate of said third N-channel transistor, said gate of said second N-channel leaker device connected to a said inverted input.

20. The circuit of claim 19, including
a first risetime control device having a source-drain path and having a gate, said source-drain path of said first risetime control device connected between said supply voltage and said gate of said second N-channel transistor, said gate of said first risetime control device connected to a said input, and
a second risetime control device having a source-drain path and having a gate, said source-drain path of said second risetime control device connected between said supply voltage and said gate of said third N-channel transistor, said gate of said second risetime control device connected to a said inverted input.

21. The circuit of claim 19, including
a first risetime control transistor of a predetermined conductivity-type having source-drain path and having a gate, said source-drain path of said first risetime control transistor connected between said supply voltage and said gate of said second N-channel transistor, said gate of said first risetime control transistor, said gate of said first risetime control transistor connected to a said input; and
a second risetime control transistor of said predetermined conductivity-type having a source-drain path and having a gate, said source-drain path of said second risetime control transistor connected between said supply voltage and said gate of said third N-channel transistor, said gate of said second risetime control transistor connected to a said inverted input;
wherein said predetermined conductivity-type is P-type.

22. The circuit of claim 19, including
a first risetime control transistor having source-drain channel path and having a gate, said source-drain path of said first risetime control transistor having predetermined width and length, said source-drain channel path of said first risetime control transistor connected between said supply voltage and said gate of said second N-channel transistor, said gate of said first risetime control transistor connected to a said input; and
a second risetime control transistor having source-drain channel path and having a gate, said source-drain path of said second risetime control transistor having a predetermined width and length, said source-drain channel path of said second risetime control transistor connected between said supply voltage and said gate of said third N-channel transistor, said gate of said second risetime control transistor connected to a said inverted input;
wherein said risetime of said output voltage at said output is determined by said predetermined source-drain channel path widths and lengths of said first and second risetime control transistors.

23. The circuit of claim 19, wherein said first and second leaker devices are N-channel field-effect transistors.

24. The circuit of clam 19, wherein the duration of said output voltage at said output is determined by the widths and lengths of said source-drain paths of said first and second leaker devices.

25. The circuit of clam 19, including an inverter having an input, said input of said inverter connected to said output of said circuit.

26. The circuit of claim 19, including
an inverter having an input and having an output, said input of said inverter connected to said output of said circuit; and
a NOR circuit having an input, said input of said NOR circuit connected to said output of said inverter.

27. The circuit of claim 19, including
an inverter having an input and having an output, said input of said inverter connected to said output of said circuit;
a NOR circuit having an input and having an output, said input of said NOR circuit connected to said output of said inverter; and
a NAND circuit having an input, said input of said NAND circuit connected to said output of said NOR circuit.

* * * * *